(12) United States Patent
Segawa

(10) Patent No.: US 6,674,244 B2
(45) Date of Patent: *Jan. 6, 2004

(54) ELECTROLUMINESCENCE DISPLAY DEVICE

(75) Inventor: Yasuo Segawa, Gifu (JP)

(73) Assignee: Sanyo Electric Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/267,319

(22) Filed: Oct. 8, 2002

(65) Prior Publication Data

US 2003/0057862 A1 Mar. 27, 2003

Related U.S. Application Data

(63) Continuation of application No. 09/521,747, filed on Mar. 9, 2000, now Pat. No. 6,492,778.

(30) Foreign Application Priority Data

Mar. 11, 1999 (JP) .............................................. 11-65319

(51) Int. Cl.⁷ ................................................. G09G 3/10
(52) U.S. Cl. ..................... 315/169.3; 313/309; 313/495
(58) Field of Search .......................... 315/169.1, 169.3, 315/169.2; 313/129, 137, 309, 504, 506, 495, 496; 345/76, 92

(56) References Cited

U.S. PATENT DOCUMENTS

| | | | |
|---|---|---|---|
| 4,617,491 A | * 10/1986 | Kishino et al. ............. 313/497 |
| 4,758,765 A | * 7/1988 | Mitsumori ................... 313/506 |
| 5,404,074 A | 4/1995 | Watanabe et al. ............ 313/495 |
| 5,606,225 A | 2/1997 | Levine et al. ............. 315/169.3 |
| 5,757,139 A | 5/1998 | Forrest et al. ........... 315/169.3 |
| 6,144,144 A | 11/2000 | Cleeves et al. ............. 313/309 |
| 6,492,778 B1 | * 12/2002 | Segawa .................... 315/169.3 |
| 6,522,079 B1 | * 2/2003 | Yamada .................... 315/169.3 |
| 6,531,815 B1 | * 3/2003 | Okuyama et al. ........... 313/506 |
| 6,603,256 B1 | * 8/2003 | Itoh et al. .................... 313/496 |

* cited by examiner

Primary Examiner—Don Wong
Assistant Examiner—Jimmy T. Vu
(74) Attorney, Agent, or Firm—Cantor Colburn LLP

(57) ABSTRACT

In an organic EL display device including a TFT (40) and an organic EL element (60) formed on an insulating substrate (10) of a glass substrate, insulating films, namely, a planarization insulating film (17), an interlayer insulating film (15), and a gate insulating film (12), for forming the TFT (40) are not provided at a region for forming the organic EL element (60). Instead, an opening (65) formed by removing these insulating films is provided to expose the glass substrate (10), and at this exposed region an anode (61), an emissive element layer (62), and a cathode (63) are formed in this order. Consequently, light emitted from the emissive element layer (62) is prevented from reflecting at interfaces between these insulating films (12, 15, and 17), and efficiently exits from the glass substrate (10) side.

8 Claims, 4 Drawing Sheets

ELECTROLUMINESCENCE DISPLAY DEVICE

CROSS REFERENCE TO RELATED APPLICATIONS

This application is a continuation application of U.S. Pat. No. 09/521,747, filed on Mar. 9, 2000, now U. S. Pat. No. 6,492,778 which is herein incorpoiated by reference in its entirety.

BACKGROUND OF THE INVENTION

1. Field of the Invention

The present invention relates to an electroluminescence (EL) display device comprising a thin film transistor (TFT) and an EL element in which the TFT is employed as a switching element.

2. Description of the Related Art

FIG. 1 is a plan view showing a display pixel portion of an EL display device of a related art, and FIGS. 2A and 2B are cross sectional views illustrating the EL display device taken along the lines A—A and B—B in FIG. 1, respectively.

Referring to FIG. 1, a display pixel is formed in a region surrounded by gate signal lines 51 and drain signal lines 52. A first TFT 30 is provided near an intersection of these signal lines, and has a source 13s serving as a capacitor electrode 55 which forms a capacitor with a storage capacitor electrode line 54, and connected to a gate 41 of the second TFT 40. The second TFT 40 has a source 43s connected to an anode 61 of an organic EL element 60, and a drain 43d connected to a power source line 53 for driving the organic EL element.

The storage capacitor electrode line 54 is disposed near the TFTs inparallel to the gate signal line 51. The line 54 is composed of chromium or the like and stores electric charges to form a capacitor with the capacitor electrode 55 connected to the source 13s of the TFT with a gate insulating film 12 interposed therebetween. The storage capacitor is provided to retain a voltage applied to the gate electrode 41 of the second TFT 40.

Thus, display pixels each having the organic EL element 60 and the TFTs 30 and 40 are arranged in a matrix on a substrate 10, thereby forming an organic EL display device.

Referring to FIGS. 2A and 2B, the organic EL display device is composed of the TFTs and the organic EL element formed in succession on a substrate 10, such as a substrate formed of glass, synthetic resin, or the like, an electrically conductive substrate, and a semiconductor substrate. When a conductive or semiconductor substrate is used for the substrate 10, an insulating film of $SiO_2$, SiN, or the like is first formed on the substrate 10 before the TFTs 30 and 40 and the organic EL display element 60 are provided.

The first TFT 30 for switching operation will next be described.

As shown in FIG. 2A, on the insulating substrate 10 of quartz glass, non-alkaline glass, or the like, the gate signal line 51 formed of refractory metal, such as chromium (Cr) and molybdenum (Mo), and serving as a gate electrode 11, and the drain signal line 52 formed of aluminum (Al) are provided, and the power source line 53 formed of Al and serving as a driving power source for the organic EL element is disposed.

Thereafter, a gate insulating film 12 and an active layer 13 of a polysilicon (p-Si) film are formed in this order. The active layer 13 is of a so-called LDD (lightly doped drain) structure, and the source 13s and a drain 13d are provided on the outer sides thereof.

An interlayer insulating film 15 composed of an $SiO_2$ film, an SiN film, and an $SiO_2$ film formed in this order is provided over the entire surface, covering the gate insulating film 12, the active layer 13, and a stopper insulating film 14. A drain electrode 16 is formed by filling a metal such as Al in a contact hole provided corresponding to the drain 13d. Further, a planarization insulating film 17 is formed of organic resin or the like over the entire surface for planarization.

The second TFT 40 for driving the organic EL element 60 will next be described.

As shown in FIG. 2B, the gate electrode 41 is formed of refractory metal, such as Cr and Mo, on the insulating substrate 10 formed of quartz glass, non-alkaline glass, or the like.

The gate insulating film 12 and an active layer 43 formed of a p-Si film are provided in succession.

The active layer 43 includes an intrinsic, or substantially intrinsic, channel 43c provided over the gate electrode 41, and the source 43s and the drain 43d provided on respective sides of the channel 43c by ion doping.

The interlayer insulating film 15 composed of an $SiO_2$ film, an SiN film, and an $SiO_2$ film formed in this order is next provided over the entire surface to cover the gate insulating film 12 and the active layer 43. The power source line 53 connected to a driving power source 50 is formed by filling a metal such as Al in a contact hole provided corresponding to the drain 43d. The planarization insulating film 17 of organic resin or the like is formed over the entire surface for the purpose of planarization. A contact hole is formed in the planarization insulating film 17 and the interlayer insulating film 15 at a position corresponding to the source 43s. A transparent electrode formed of ITO, i.e. the anode 61 of the organic EL element, is formed on the planarization insulating film 17 so as to contact the source 13s through the contact hole.

The organic EL element 60 includes the anode 61 formed of a transparent electrode of ITO or the like, an emissive element layer 62 of an organic compound, and a cathode 63 of a magnesium-indium alloy, formed in this order. The cathode 63 is provided over the entire surface of the substrate 10 which forms the organic EL display device, i.e. over the entire plane of the FIG. 1.

In the organic EL element, holes and electrons injected from the anode and cathode, respectively, are recombined in the emissive layer to excite organic molecules forming the emissive layer, thereby producing excitons. Light is released from the emissive layer during the process in which the excitons deactivate, and this release of light from the transparent anode through the transparent insulating substrate results in the emission of light.

With such a configuration, after the anode 61 is formed, an insulating film 64 is formed in the peripheral region of the anode 61 (the region excluding the area surrounded by broken lines) to prevent a short circuit between the cathode 63 and the anode 61, which would otherwise be generated from a crack in the emissive layer resulting from a difference in level created by the thickness of the anode 61. The emissive element layer 62 and the cathode 63 are next formed. Light emitted from the emissive element layer 62 exits after being transmitted through the insulating substrate 10.

It should be noted that while light emitted from the emissive element layer 62 advances radially outward from the emissive layer 62, not all components of the light emitted from the emissive layer 62 toward the substrate 10 reach the insulating substrate 10, and some light is reflected by, for example, the surface of the planarization insulating film, or attenuated in the film.

This results from a difference in materials between the interlayer insulating film and the planarization insulating film, especially from a difference in refractive index between these insulating films. The light may be partly reflected at the interface between respective insulating films, or even if transmitted through the film, the light may be attenuated as it is repeatedly reflected within the insulating film depending on the angle incident to the insulating film.

FIG. 3 shows how light radiated from the emissive layer travels toward the substrate.

Referring to FIG. 3, the emitted light incident on the SiN film advances at an angle $\alpha 1$ from a normal line C to the SiN film, and is then reflected at the interface between the SiN film (having a refractive index n1=2.0) and the $SiO_2$ film (having a refractive index n2=1.46). Assuming that the reflected ray forms an angle $\alpha 2$ with the normal line C, an equation n1×Sin $\alpha 1$=n2×Sin $\alpha 2$ holds true from Snell's law, and $\alpha 1=Sin^{-1}$ (n1/n2)≈47°. As the value n1 is larger than the value n2 in this example, light is totally reflected at this interface when the angle $\alpha 1$ exceeds 47°.

Therefore, only the components with the angle $\alpha 1$ smaller than 47° can travel downward, i.e. to the $SiO_2$ film, and efficiency of extracting light at this interface is 47°/90°≈52%.

As the lower region of the organic EL element includes films having different refractive indices, there is always an angle that causes total reflection when light travels from a substance with a larger refractive index to a substance with a smaller refractive index. As a result, light projected from the lower glass substrate will always have a reduced intensity.

Thus, light radiated from the emissive layer is diminished by the time it exits the insulating substrate 10, resulting in an inefficient use of the light and darkened display of the EL display device.

SUMMARY OF THE INVENTION

The present invention was conceived in view of the above-described problems, and aims to provide an EL display device allowing light emitted from an emissive layer to efficiently exit from an insulating substrate, to thereby obtain a bright display.

According to one aspect, the present invention provides a light emissive display device comprising, for each pixel, an emissive element composed of a first electrode of a transparent, electrically conductive material; an emissive element layer; and a second electrode of an opaque, electrically conductive material formed in this order, and a switching element for driving the emissive element. At least part of the first electrode of the emissive element is formed in a direct contact with a surface of the transparent substrate.

According to another aspect of the present invention, the switching element is formed on the transparent substrate, and an insulating layer is formed over the switching element to insulate the emissive element from the switching element except for a necessary region and separate these two elements. The insulating layer includes an opening in each pixel region, and the first electrode of the emissive element covers the surface of the transparent substrate exposed by the opening.

According to a still another aspect of the present invention, the switching element is a thin film transistor, and a gate insulating layer is formed on the transparent substrate for insulating a gate of the thin film transistor from an active layer, and the opening of said insulating layer passes through said gate insulating.

According to a further aspect of the present invention, the insulating layer for insulating a region of the emissive element from the switching element and for separating the two elements includes an interlayer insulating layer and a planarization insulating layer for planarizing a surface of a region located over the switching element.

For example, the interlayer insulating layer may be composed of multiple layers including silicon dioxide and/or silicon nitride, and the planarization insulating layer includes insulating resin. The first electrode may include indium tin oxide. The gate insulating layer may include, for example, silicon dioxide The first electrode may include, for example, indium tin oxide.

In the device structured as described above, no layers with different refractive indices exist in a region where the first electrode directly contacts the transparent substrate, so that undesirable reflection of light emitted from the emissive element layer at an interface between layers with different refractive indices can be prevented, thereby making it possible for light to efficiently pass outside after being transmitted through the first electrode and the transparent substrate.

According to a further aspect of the present invention, the switching element is formed on the transparent substrate, an insulating layer is formed over the switching element for insulating the emissive element from the switching element except for a necessary region and separating the two elements, and includes an opening, in each pixel region, having a diameter increasing from the center of the region toward an outer end.

According to a further aspect of the present invention, the switching element is formed on the transparent substrate, and an insulating layer is formed over the switching element for insulating the emissive element from the switching element except for a necessary region and separating the two elements, and has an opening, in each pixel region, having a diameter increasing from the center of the region toward an outer end. Further, the first electrode is formed as an individual electrode in each pixel, and a planarization insulating film is formed in the vicinity of an edge of the first electrode for separating the first electrode from the emissive element layer and the second electrode and having a tapered surface with a thickness increasing from the center of the first electrode toward an outer end.

Tapering the opening in the insulating film for insulating and separating the emissive element from the switching element prevents generation of a discontinuity which would otherwise be generated by a difference in level created in the vicinity of an end of the opening in the first electrode, the emissive element layer, the second electrode, and the like formed to cover the opening.

A planarization insulating film is formed in the vicinity of the end of the first electrode for separating the first electrode from the emissive element layer and the second electrode, and having a tapered surface with a thickness increasing from the center of the first electrode toward an outer end. This will lead to prevention of a discontinuity in the second electrode in the vicinity of the end of the first electrode.

According to a further aspect of the present invention, the emissive element is an electroluminescence element.

According to a further aspect of the present invention, the emissive element is an organic electroluminescence element with the emissive element layer formed of an organic compound.

Forming the emissive element layer of an organic compound is extremely advantageous in display devices and the like because this configuration offers a wide variety of displayable colors and a wide range of options for the material used.

DESCRIPTION OF THE PREFERRED EMBODIMENTS

An EL display device according to the present invention will next be described.

Figure 4:
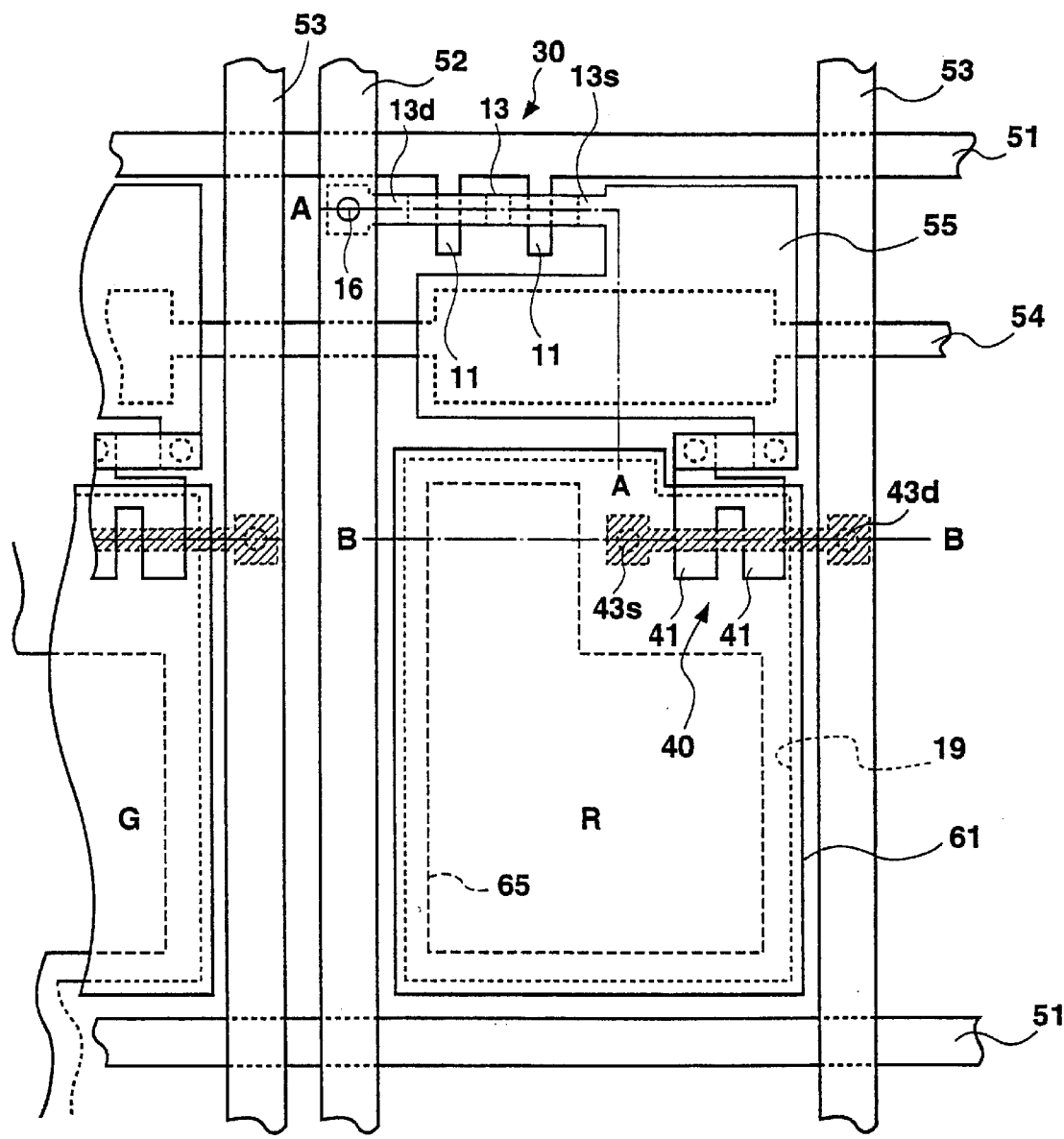
FIG. 4 is a plan view showing an EL display device according to an embodiment of the present invention.
Figure 5:
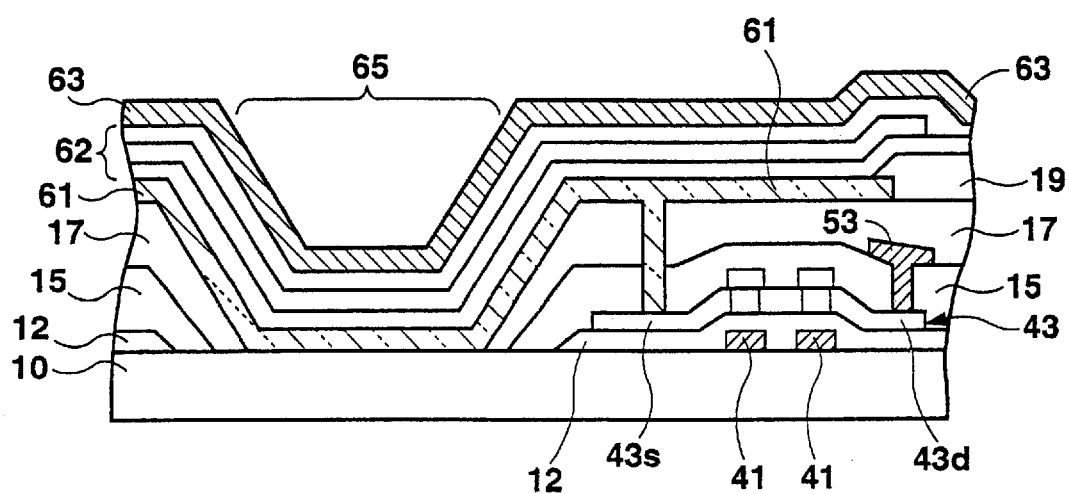
FIG. 5 is a cross sectional view taken along the line B—B in FIG. 4.

FIG. 4 is a plan view illustrating a display pixel portion of an EL display device of the present invention, and FIG. 5 is a cross sectional view taken along the line B—B in FIG. 4. The cross section taken along the line A—A in FIG. 4 is not illustrated because it is the same as that shown in FIG. 2A referred to in the above description.

Referring to FIG. 4, a display pixel including an organic EL element is formed in a region surrounded by gate signal lines 51 and drain signal lines 52. A first TFT 30 is provided near an intersection of these signal lines, and has a source 13s serving as a capacitor electrode 55 which forms a capacitor with a storage capacitor electrode line 54, and connected to a gate 41 of a second TFT 40. The second TFT 40 has a source 43s connected to an anode 61 of an organic EL element 60, and a drain 43d connected to a power source line 53 for driving the organic EL element.

The storage capacitor electrode line 54 is disposed near the display pixel in parallel to the gate signal line 51. The line 54 is made of chromium or the like, and stores electric charges to form a capacitor with the capacitor electrode 55 connected to the source 13s of the TFT with a gate insulating film 12 interposed therebetween. The storage capacitor is provided to retain a voltage applied to the gate electrode 41 of the second TFT 40.

Thus, display pixels each having the organic EL element 60, and the TFTs 30 and 40 are arranged in a matrix on a substrate 10, to thereby form an organic EL display device.

Referring to FIG. 5, the organic EL display device is composed of the TFTs and the organic EL element formed in succession on a substrate 10. The substrate 10 may be a substrate formed of glass, synthetic resin, or the like, or a conductive or semiconductor substrate. When a conductive or semiconductor substrate is used for the substrate 10, an insulating film of $SiO_2$, SiN, or the like is first formed on the substrate 10 before the TFTS and the organic EL display element are provided.

In the present embodiment, both the first and second TFTs 30 and 40 are of a so-called bottom gate type, in which gate electrodes 11 and 41 are provided under active layers 13 and 43, respectively, and a p-Si film is used for the active layer which is a semiconductor film. Further, in this embodiment, the gate electrodes 11 and 41 are of the double gate structure.

Figure 1:
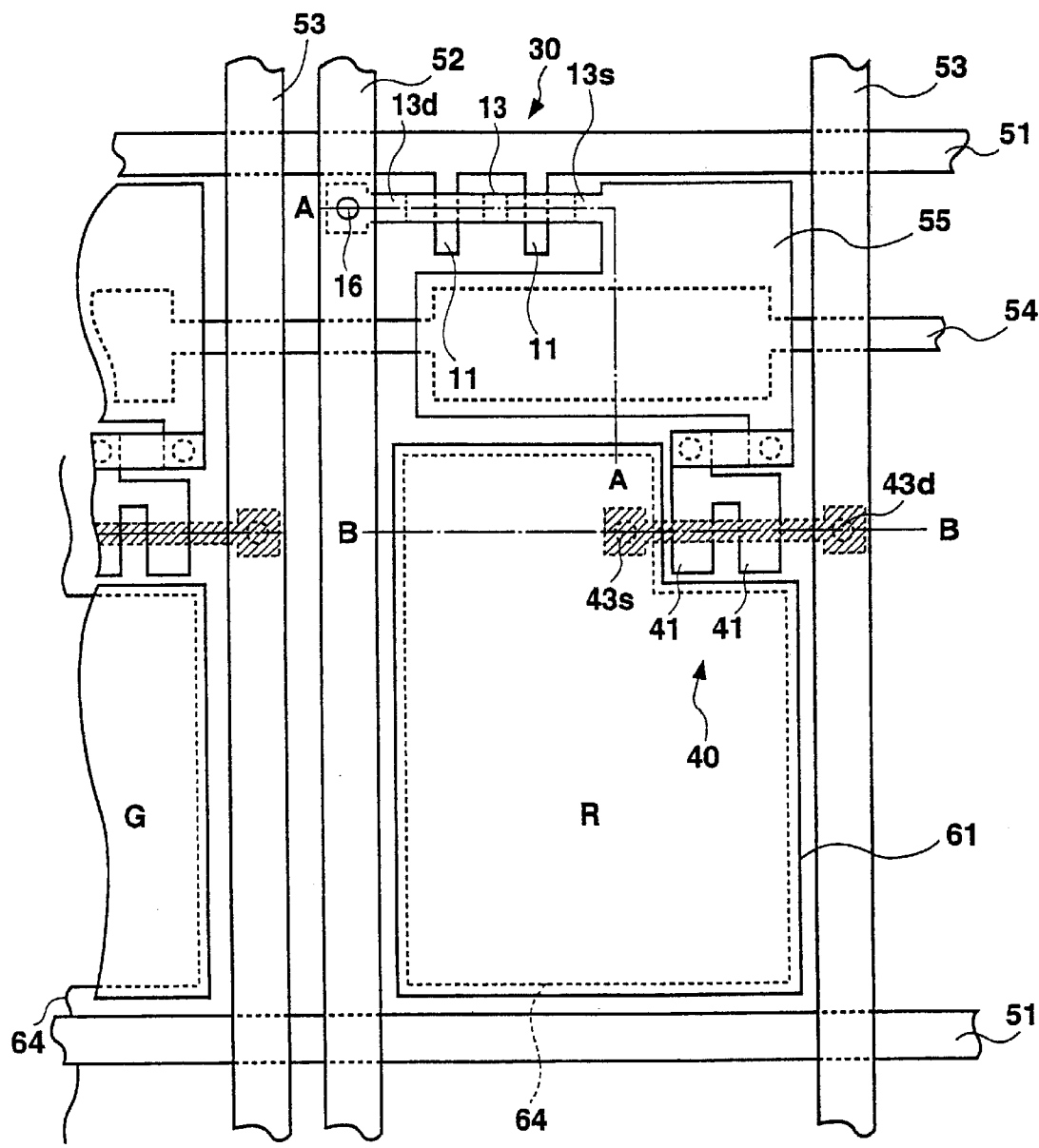
FIG. 1 is a plan view showing an EL display device of a related art.
Figure 2A:
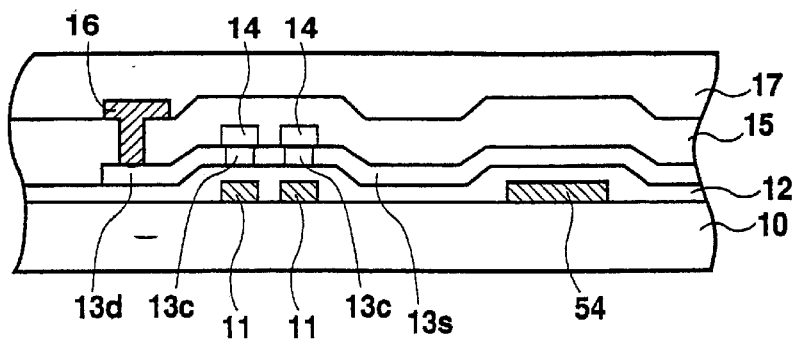
FIGS. 2A and 2B are cross sectional views taken along the lines A—A and B—B in FIG. 1, respectively.
Figure 2B:
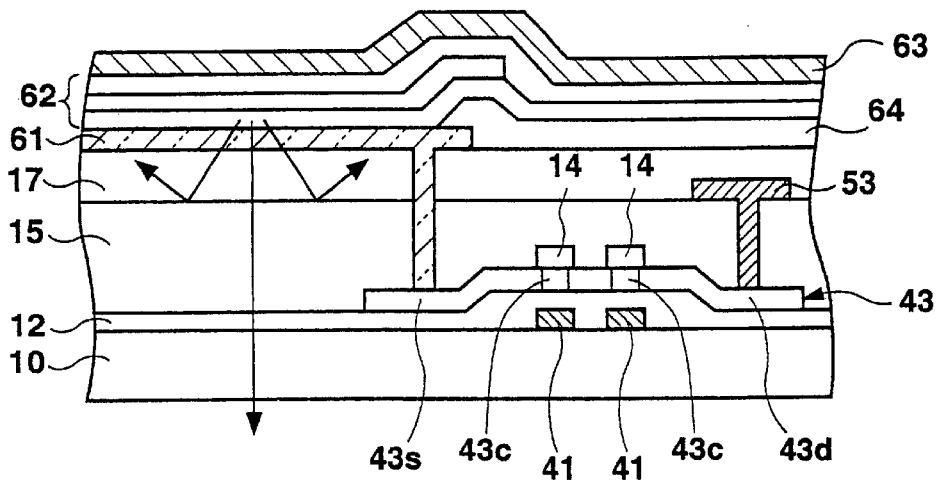
Figure 3:
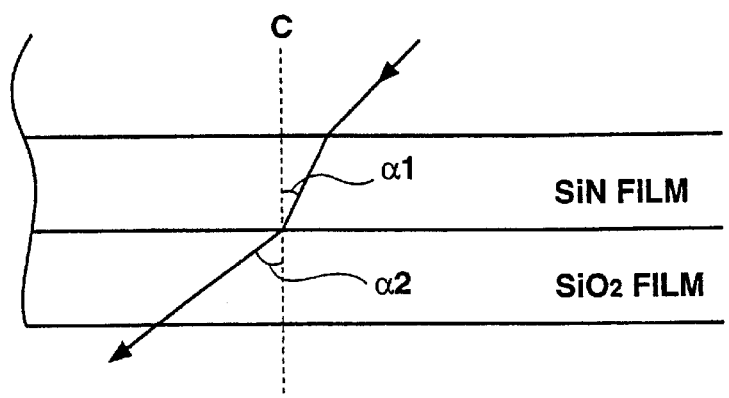
FIG. 3 illustrates the path of light traveling through the emissive element layer.

Since the first TFT 30 for switching operation has the same structure as that described with reference to FIG. 2A, description thereof will not be repeated.

The second TFT 40 for driving the organic EL element 60 will next be described with reference to FIG. 5.

As shown in FIGS. 4 and 5, the gate electrode 41 of refractory metal, such as Cr and Mo, is formed on the insulating substrate 10 of quartz glass, non-alkaline glass, or the like. A gate insulating film 12 is formed of $SiO_2$ or the like to cover the gate electrode 41, and the active layer 43 of a p-Si film is formed on the gate insulating film 12 in a region for forming the second TFT 40.

The active layer 43 includes an intrinsic, or substantially intrinsic, channel 43c provided over the gate electrode 41, and the source 43s and the drain 43d provided on respective sides of the channel 43c by ion doping.

A multi-layered interlayer insulating film 15 composed of, for example, an $SiO_2$ film, an SiN film, and an $SiO_2$ film in this order is next formed over the entire surface to cover the gate insulating film 12 and the active layer 43. The power source line 53 connected to a driving power source is formed by filling a metal such as Al in a contact hole provided in the layer 15 at a position corresponding to the drain 43d. A planarization insulating film 17 of organic resin or the like is formed over the entire surface for the purpose of planarization. A contact hole is formed in the planarization insulating film 17 and the interlayer insulating film 15 at a position corresponding to the source 43s. A transparent electrode formed of ITO , i.e. the anode 61 of the organic EL element, is formed on the planarization insulating film 17 so as to contact the source 43s through the contact hole.

Thus, part of the organic EL element 60 is disposed over the TFT 40 with the insulating films (15, 17) interposed therebetween. The TFT 40 and the element 60 are insulated from each other by the insulating films (15, 17) except for a necessary region, that is, part of the anode of the EL element and the source 43s of the TFT connected through the contact hole. The insulating films (15, 17) horizontally separate the TFT and the EL element from each other.

The organic EL element 60 is composed of the anode 61 formed of a transparent electrode of ITO or the like, an emissive element layer 62, and a cathode 63 of a magnesium-indium alloy, formed in this order. The cathode 63 is provided over the entire surface of the substrate 10 used for forming the organic EL display device shown in FIG. 4, i.e. over the entire plane of the sheet. The emissive element layer 62 is composed of, for example, a first hole-transport layer of MTDATA (4,4',4"-tris(3-methlphenylphenylamino)triphenylamine), a second hole-transport layer of TPD (N,N'-diphenyl-N,N'-di(3-methylphenyl)-1,1'-biphenyl-4,4'-diamine), an emissive layer of Bebq2 (bis(10-hydroxybenzo[h]quinolinato) beryllium) including quinacridone derivatives, and an electron-transport layer of Bebq2, formed in succession on the anode 61. As shown in FIG. 5, while the emissive layer is formed as a separate pattern for each pixel as is the anode 61 and occupying a little wider area than the anode 61, the first and second hole-transport layers and the electron-transport layer sandwiching the emissive layer are formed over the entire surface of the substrate and shared by respective pixels similarly to the cathode 63.

In the organic EL element, holes and electrons injected from the anode and cathode, respectively, are recombined in the emissive layer to excite organic molecules forming the emissive layer, thereby producing excitons. Light is released from the emissive layer during the process in which the excitons deactivate, and this release of light from the transparent anode through the transparent insulating substrate causes light to be emitted to the outside.

The gate insulating film 12, the interlayer insulating film 15, and the planarization insulating film 17 formed for providing the TFT 40 are removed at a region for forming an organic EL display element before formation of this element.

In other words, an opening 65 is formed in the insulating films 12, 15, and 17 at the region where the organic EL element is to be provided, and therefore the surface of the insulating substrate 10 is exposed before the organic EL element is formed.

Accordingly, the anode 61 is formed directly on the exposed region of the insulating substrate 10 and on part of the portion located over the TFT 40. Thus, as no insulating films with different refractive indices exist on the light emitting side of the EL element, total reflection of the light due to differing refractive indexes does not occur. As a result, light can be more efficiently extracted from the insulating substrate 10 side, to thereby achieve a bright display.

Removal of the insulating films provided when the TFT 40 is formed from the region for forming the organic EL element may be performed each time an insulating film is formed. Alternatively, the insulating films may be removed from the region for forming the organic EL element at the same time the contact hole is formed in the planarization insulating film 17 and the interlayer insulating film 15 at the position corresponding to the source 43s after formation of the TFT 40 is completed. The latter is preferable because it does not increase the number of manufacturing steps. In addition, the opening 65 resulting from removal of the, insulating films preferably has a diameter outwardly increasing from the center thereof, as shown in FIG. 5. Such a tapered opening 65 prevents discontinuity in the anode, the emissive layer, and the cathode at an end of the opening, and prevents short circuiting between the anode and the cathode.

On the exposed portion of the insulating substrate 10, ITO, a material of the anode 61, is deposited and then etched. Outside of the region indicated by the broken lines, a planarization insulating film 19 is next formed around the thus formed anode 61. This film is provided for preventing short circuiting between the cathode 63 and the anode 61 which might otherwise be caused by a crack in the emissive layer resulting from a difference in level generated by the thickness of the anode 61. The layers of the above-described materials are deposited on the anode 61 to form the emissive layer 62. On this layer 62, the cathode 63 shared by respective organic EL elements is formed of an opaque material, namely, a magnesium-indium alloy, over the entire surface of the substrate 10 including the region located over the TFT 40.

In the thus fabricated organic EL device, as the organic EL element is formed in the opening 65, i.e. directly on the insulating substrate 10, no components of light emitted from the emissive layer are reflection by the insulating films forming the TFT 40, namely, the planarization insulating film 17, the interlayer insulating film 15, and the gate insulating film 12. As a result, a brighter organic EL display device can be obtained. Because emitted light is more efficiently utilized, this brighter display can be achieved without increasing the current supplied to the organic EL element, which contributes to increasing the lifespan of the element.

What is claimed is:

1. A light emissive display device, comprising, for each pixel:
   an emissive element composed of a first electrode of a transparent, electrically conductive material; an emissive element layer; and a second electrode of an opaque, electrically conductive material, formed in this order; and
   a switching element for driving said emissive element; wherein
   at least part of said first electrode of said emissive element is formed in direct contact with a surface of a transparent substrate.

2. The device according to claim 1, wherein said first electrode includes indium tin oxide.

3. A light emissive display device, comprising, for each pixel:
   an emissive element composed of a first electrode of a transparent, electrically conductive material; an emissive element layer; and a second electrode of an opaque, electrically conductive material, formed in this order; and
   a switching element for driving said emissive element; wherein
   at least part of said first electrode of said emissive element is formed in direct contact with a surface of a transparent substrate, and wherein said first electrode includes indium tin oxide.

4. The device according to claim 3, wherein said emissive element is an electroluminescence element.

5. The device according to claim 3, wherein said emissive element is an organic electroluminescence element including said emissive element layer of an organic compound.

6. The device according to claim 3, wherein light emitted from said emissive element passes through said first electrode and said transparent substrate.

7. A light emissive display device, comprising, for each pixel:
   an emissive element composed of a first electrode of a transparent, electrically conductive material; art emissive element layer; and a second electrode of an opaque, electrically conductive material, formed in this order; and
   a switching element for driving said emissive element; wherein
   said first electrode of said emissive element is an individual electrode separately formed for each pixel, at least part of said first electrode being formed in direct contact with a surface of a transparent substrate.

8. The device according to claim 7, wherein said first electrode includes indium tin oxide.

* * * * *